(12) United States Patent
Watanabe et al.

(10) Patent No.: US 8,278,212 B2
(45) Date of Patent: Oct. 2, 2012

(54) METHOD FOR MANUFACTURING SEMICONDUCTOR MEMORY ELEMENT AND SPUTTERING APPARATUS

(75) Inventors: Eisaku Watanabe, Komae (JP); Tetsuro Ogata, Chofu (JP); Franck Ernult, Chofu (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/097,529

(22) Filed: Apr. 29, 2011

(65) Prior Publication Data

US 2011/0312178 A1 Dec. 22, 2011

Related U.S. Application Data

(63) Continuation of application No. PCT/JP2009/070547, filed on Dec. 8, 2009.

(30) Foreign Application Priority Data

Dec. 22, 2008 (JP) .................................. 2008-325310

(51) Int. Cl.
*H01L 21/44* (2006.01)
(52) U.S. Cl. ............ 438/656; 204/298.13; 257/E21.169
(58) Field of Classification Search .................... 438/84, 438/95, 102, 656; 257/E21.159; 204/298, 204/192.12, 298.01; 148/518
See application file for complete search history.

(56) References Cited

U.S. PATENT DOCUMENTS

| 5,108,569 A * | 4/1992 | Gilboa et al. ............ 204/192.13 |
| 5,489,367 A * | 2/1996 | Kubota et al. ............ 204/192.15 |
| 6,203,674 B1 * | 3/2001 | Yamaguchi .............. 204/192.22 |
| 7,456,420 B2 | 11/2008 | Cote et al. ............... 257/4 |
| 2005/0205413 A1 | 9/2005 | Ikari et al. ............... 204/192.13 |
| 2007/0210296 A1 * | 9/2007 | Cote et al. .............. 257/2 |

FOREIGN PATENT DOCUMENTS

| JP | 10-209084 A | 8/1998 |
| JP | 2003-342725 A | 12/2003 |
| JP | 2006-124811 A | 5/2006 |

(Continued)

OTHER PUBLICATIONS

International Search Report and International Preliminary Report on Patentability issued in International Application No. PCT/JP2009/070547—8 pages.

(Continued)

*Primary Examiner* — William D Coleman
*Assistant Examiner* — Christine Enad
(74) *Attorney, Agent, or Firm* — Fitzpatrick, Cella, Harper & Scinto (57) ABSTRACT

The present invention provides a method for manufacturing a semiconductor memory element including a chalcogenide material layer and an electrode layer, each having an improved adhesion, and a sputtering apparatus thereof. One embodiment of the present invention is the method for manufacturing a semiconductor memory element including: a first step of forming the chalcogenide material layer (113); and a second step of forming a second electrode layer (114*b*) on the chalcogenide material layer (113) by sputtering through the use of a mixed gas of a reactive gas and an inert gas, while applying a cathode voltage to a target. In the second step, introduction of the reactive gas is carried out at a flow rate ratio included in a hysteresis area (40) appearing in the relationship between a cathode voltage applied to the cathode and the flow rate ratio of the reactive gas in the mixed gas.

4 Claims, 5 Drawing Sheets

FOREIGN PATENT DOCUMENTS

JP    2007-243180 A    9/2007

OTHER PUBLICATIONS

Kim et al., "Structural phase transitions of $Ge_2Sb_2Te^5$ cells with TiN electrodes using a homemade W heater tip", Applied Physics Letters, 90, 083103, 1-3 (2007).

Kang et al., "One-dimensional heat conduction model for an electrical phase change random access memory device with an $8F^2$ memory cell (F=0.15 µm)", Journal of Applied Physics, vol. 94, No. 5, Sep. 2003, pp. 3536-3542.

Cabral, Jr., et al., "Irreversible modification of $Ge_2Sb_2Te_5$ phase change material by nanometer-thin Ti adhesion layers in a device-compatible stack", Applied Physics Letters, 90, 051908, 1-3 (2007).

Liu et al., "Study on Adhesive Strength between $Ge_2Sb_2Te_5$ Film and Electrodes for Phase Change Memory Application", Japanese Journal of Applied Physics, 48, 101601, 1-5 (2009).

* cited by examiner

|  |  | CENTRAL AREA | | PERIPHERAL AREA | |
| --- | --- | --- | --- | --- | --- |
|  |  | NOT PRESENT | PRESENT | NOT PRESENT | PRESENT |
| N FLOW RATE RATIO (%) | 0 | ○ | 3/9 | ○ | 2/9 |
|  | 20 | × | 7/9 | × | 9/9 |
|  | 40 | ○ | 0/9 | ○ | 0/9 |
|  | 50 | × | 4/9 | × | 5/9 |
|  | 60 | ○ | 7/9 | × | 4/9 |
|  | 80 | × | 9/9 | × | 6/9 |

PRESENT: THERE ARE NOTCHES
NOT PRESENT: THERE ARE NO NOTCH
○ : FILM PEELING NOT OBSERVED
× : FILM PEELING OBSERVED
3/9: THREE GRIDS AMONG NINE GRIDS OF NOTCHES WERE SEPARATED

FIG. 7

METHOD FOR MANUFACTURING SEMICONDUCTOR MEMORY ELEMENT AND SPUTTERING APPARATUS

CROSS-REFERENCES TO RELATED APPLICATIONS

This application is a continuation application of International Application No. PCT/JP2009/070547, filed Dec. 8, 2009, which claims the benefit of Japanese Patent Application No. 2008-325310, filed Dec. 22, 2008. The contents of the aforementioned applications are incorporated herein by reference in their entities.

TECHNICAL FIELD

The present invention relates to a method for manufacturing a semiconductor integrated circuit device such as a phase change memory cell formed by using a phase change material such as chalcogenide, especially to a method for manufacturing an electrode for the phase change memory cell, and an apparatus for manufacturing the same.

BACKGROUND ART

The phase change memory has been received attention as a next-generation nonvolatile memory referred to as a universal memory. The phase change memory is an element performing memorizing whether a part of a phase change film is put into an amorphous state or into a crystalline state through the use of the "phase change film" and performing read-out through the use of resistance change accompanied with the state change.

As the phase change film, materials, such as a chalcogenide material, and a mixture of germanium (Ge), antimony (Sb) and tellurium (Te), generally referred to as GST, are used. There has been a problem of interlayer peeling between the chalcogenide material and an upper electrode provided on the material.

In order to solve this problem, in Patent Document 1, a method for forming an electrode for a memory material of a phase change memory device has been disclosed. The method includes the steps of: forming a first layer adhered on the top surface of the memory material and which contains an nitride (ANx) (where, A is either one of titanium (Ti) or tungsten (W), and x is smaller than 1.0); and forming a second layer adhered on the first layer and which contains a nitride (ANy) (where, y is equal to or greater than 1.0).

Patent Document 1: Japanese Patent Application Laid-Open Publication No. 2007-243180.

SUMMARY OF INVENTION

In the conventional manufacturing method, however, adhesion between a chalcogenide material layer as a memory material and an electrode layer was far from being sufficient, and thus, there has still been a problem of the peeling of the electrode layer from the chalcogenide material layer.

Therefore, the object of the present invention is to provide a method for manufacturing the semiconductor memory element including a chalcogenide material layer and an electrode layer each having improved adhesion of a film, and an apparatus for manufacturing the same.

For achieving such an object, first aspect of the present invention is a method of manufacturing a semiconductor memory device, comprising: a first step of forming a chalcogenide material layer; and a second step of forming an electrode layer on the chalcogenide material layer by sputtering through the use of a mixed gas of a reactive gas and an inert gas, while applying a cathode voltage to a target wherein the target is a target capable of performing sputtering in a metal mode, and in the second step, introduction of the reactive gas is carried out at a flow rate ratio of the reactive gas in the mixed gas corresponding to a hysteresis area appearing in a relationship between the cathode voltage and a flow rate ratio of the reactive gas in the mixed gas.

Moreover, second aspect of the present invention is a sputtering apparatus for forming an electrode layer on a chalcogenide layer, comprising: a treatment chamber; a cathode disposed to the treatment chamber and for mounting a target thereon; an inert gas introduction means for introducing an inert gas in the treatment chamber; a reactive gas introduction means for introducing a reactive gas in the treatment chamber; and a control section controlling the inert gas introduction means and the reactive gas introduction means, wherein the control section controls the inert gas introduction means and the reactive gas introduction means so as to introduce the reactive gas in the treatment chamber at a flow rate ratio corresponding to a hysteresis area appearing in a relationship between a cathode voltage applied to the cathode and a flow rate ratio of the reactive gas in a mixed gas of the reactive gas and the inert gas.

According to the manufacturing method of the present invention, the peeling of the electrode layer from the chalcogenide layer can be prevented or reduced through the improvement of the degree of adhesion between the chalcogenide layer and the electrode layer formed thereon.

DESCRIPTION OF EMBODIMENTS

Hereinafter, embodiments of the present invention will be described with reference to drawings. In addition, in the drawings described below, components having the same function will be denoted by the same reference numerals and repeated description of them will be omitted.

Figure 1:
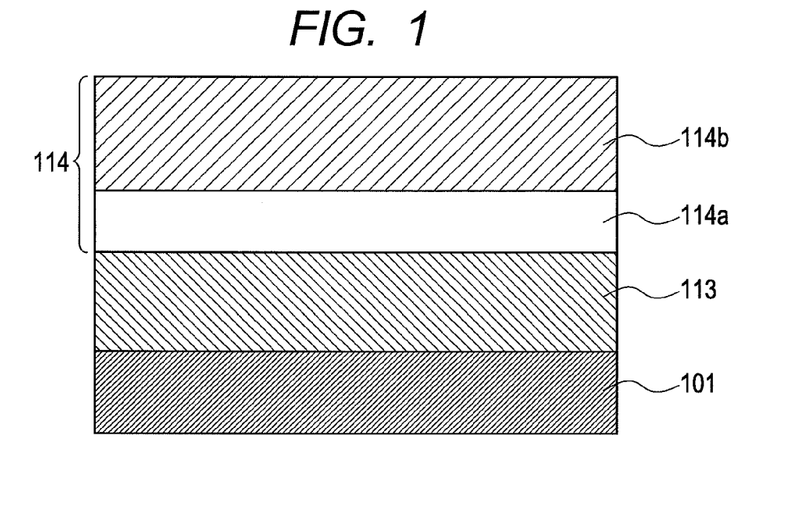
FIG. 1 is a schematic configuration view illustrating one example of a phase change memory cell applicable to the present invention.

With reference to FIG. 1, the configuration of a semiconductor memory element applicable to the present invention will be explained. FIG. 1 is a schematic cross-sectional view of a phase change memory cell that is one example of the semiconductor memory element.

As illustrated in FIG. 1, the phase change memory cell includes: a substrate 101, a chalcogenide material layer 113 sequentially laminated on the substrate 101, and upper electrode layers 114 (a first electrode layer 114a and a second electrode layer 114b). Thus, the first electrode layers 114a such as a Ti layer functions as a buffer layer between the chalcogenide material layer 113 and the second electrode layer 114b, and thus, in order to improve the degree of adhesion of the second electrode layer 114b it is preferable to provide a first electrode layer 114a.

It should be noted that the chalcogenide material layer is referred to as a memory layer which memorizes information by causing a reversible phase change between a crystalline phase and an amorphous phase.

Moreover, the feature of the phase change memory is that since the resistance value of the chalcogenide material changes by two to three digits depending on its crystalline state and the value is used as a signal, the read-out signal is large, a sensing operation is facilitated, and the high read-out speed is achieved. In addition to this, the memory has the performance of compensating the defect of a flash memory including being capable of re-writing the memory $10^4$ times or more. Moreover, the phase change memory has features, such as, capability of operation at a low voltage and low electric power, and ease for being mounted together with a logic circuit, and thus, the memory is suitable for a mobile apparatus.

As a material of the substrate 101, silicon oxide $SiO_2$ is generally used, but the material is not limited to it. For example, a polycarbonate substrate with low heat resistance can be used in the case of an optical disc. In this example, the thickness of the substrate is 100 nm, but the thickness is not limited to this value. Moreover, although not illustrated in the figure, titanium nitride or tungsten nitride serving as an lower layer electrode may be provided below the chalcogenide layer.

A material of the chalcogenide material layer 113 includes GeSbTe, but the material is not limited to GeSbTe, and a chalcogenide material containing at least two or more elements selected from Ge, Sb and Te, may be used. Furthermore, including, for example, the use of As (arsenic) instead of germanium), a chalcogenide material containing at least one element selected from group the group consisting of 2b, 1b, 3a to 7a, and 8 of periodic table may be used.

It is known that when an amorphous GeSbTe film is heat-treated, it crystallizes into a face centered cubic (hereinafter, abbreviated as fcc) structure at about 150° C., and changes its phase into a hexagonal closed packing (hereinafter, abbreviated as hcp) structure at a high temperature equal to or greater than 350° C. That is, the fcc crystal is a low-temperature stable phase, and hcp is a high-temperature stable phase of the chalcogenide. The thickness of the chalcogenide material layer 113 depends on the specification of a resistance value read-out as a signal, and, in this example, it is 70 nm.

The upper electrode layer 114 has the first electrode layer 114a and the second electrode layer 114b. As a material for the first electrode layer 114a, titanium (Ti) is used in this example, but tungsten (W) may be used. The thickness of the first electrode layer is 1 nm in this example. Although the film thickness of the first electrode layer is defined by the characteristics of a device, preferably, the first electrode layer is desired to be thinly formed in order to serve as an electrode material, and thus, it is desirable to use the first electrode layer having a thickness of 1 to 4 nm.

As a material of the second electrode layer 114b which is a characterizing portion of the present invention, titanium nitride (TiN) is used in this example, but tungsten nitride (WN) may be used. The thickness of the second electrode layer 114b in this example is 50 nm.

Next, with reference to FIGS. 2 and 3, the manufacturing apparatus for manufacturing the phase change memory cell will be explained.

Figure 2:
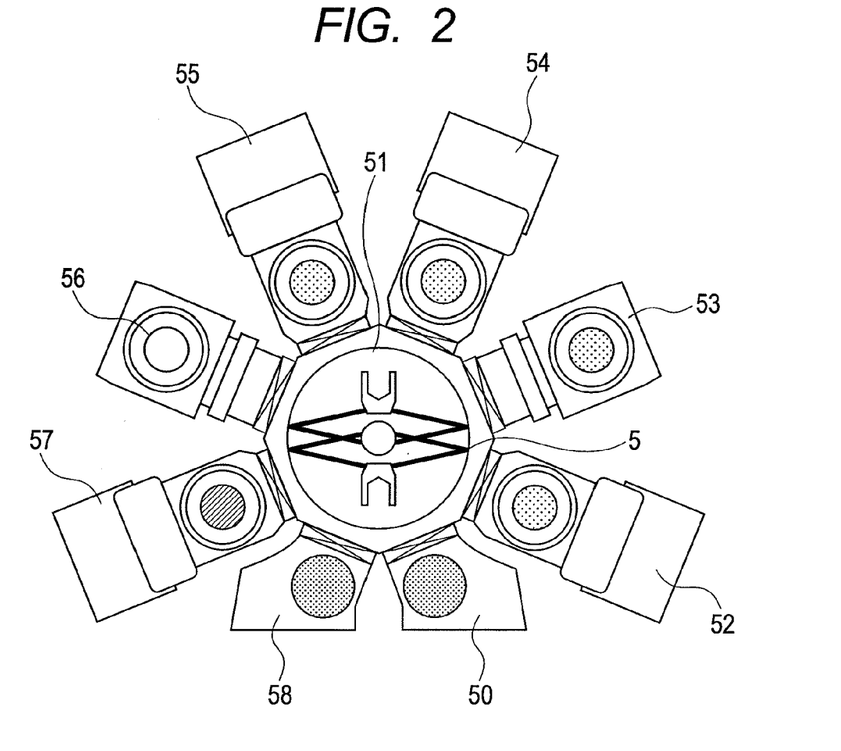
FIG. 2 is a schematic plan view of a thin film formation apparatus according to one embodiment of the present invention.

FIG. 2 is a schematic plan view of the thin film forming apparatus according to one embodiment of the present invention. FIG. 3 is a schematic cross-sectional view of the sputtering apparatus 55 installed as a chamber of thin film forming apparatus.

The thin film forming apparatus illustrated in FIG. 2 includes: a load-lock chamber 50 in which the substrate 101 stays temporarily when the substrate 101 is carried from the treatment chambers to the atmospheric side, and the transfer chamber 51 equipped with the transfer robot 5 for transferring a substrate 101. Moreover, the thin film forming apparatus includes: a heat chamber 52 for heating the substrate 101; pretreatment chamber 53 for removing impurities on the substrate by RF etching; a sputtering chamber 54 for forming the chalcogenide material layer 113 by sputtering; and a reaction sputtering chamber 55 for forming the upper electrode layers 114. Furthermore, the thin film forming apparatus further includes: a treatment chamber 56; a treatment chamber 57; and unload lock chamber 58 in which the substrate 101 stays temporarily when the substrate 101 is carried from the treatment chambers to the atmospheric side. It should be noted that the chambers are connected to each other via a gate valve in an air-tight manner.

Figure 3:
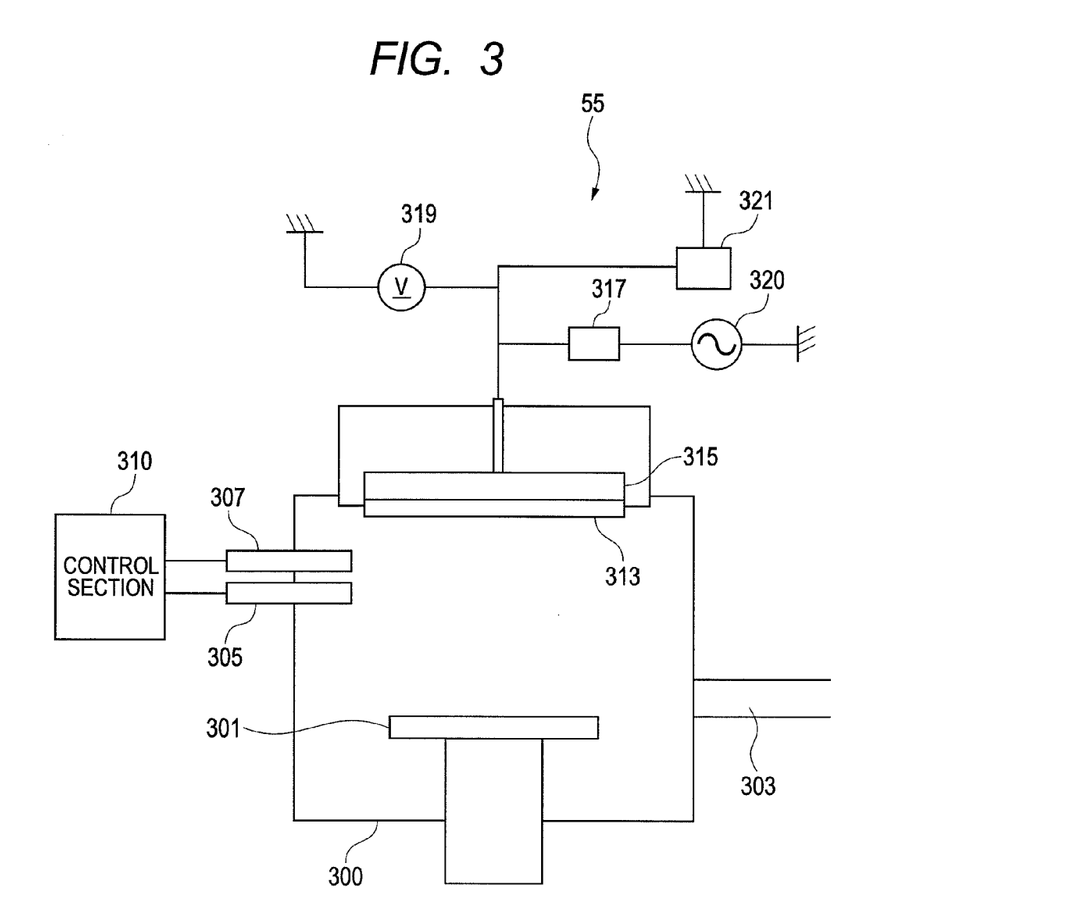
FIG. 3 is a schematic cross-sectional view of a sputtering apparatus according to one embodiment of the present invention.

With reference to FIG. 3, the reactive sputtering chamber 55 which is one of the chambers included by the thin film forming apparatus and which is for producing the second electrode layer 114b (an important step in the manufacturing process of the phase change memory cell) will be described.

The reactive sputtering apparatus 55 includes: a treatment chamber 300 connected to an exhaust system 303; a cathode 315 for mounting a metal target disposed in the treatment chamber 300; an inert gas introduction means 307 for introducing an inert gas into the treatment chamber 300; a reactive gas introduction means 305 for introducing a reactive gas into the treatment chamber 300; a substrate holder 301 disposed in the treatment chamber 300; and a control section 310 for controlling the inert gas introduction means 307 and the reactive gas introduction means 305. Moreover, a high frequency power supply 320 is connected to a cathode 315 via a DC power supply 321 and a matching circuit 317. Moreover, a voltmeter 319 for measuring a cathode voltage is connected to the cathode 315. In addition, it should be noted that the control section 310 is designed to be able to suitably set a flow rate externally by using a computer or a sequencer etc. which is separately included in the figure but provided at the control section, and is designed to control the reactive gas introduction means 305 and the inert gas introduction means 307 so that designated flow rates are flown. Moreover, the suitably selected target 313 (a titanium target or a tungsten target) is installed at the cathode 315.

Next, with reference to FIGS. 3 and 4, a method for forming the second electrode layer 114b of the phase change memory cell will be explained.

In the present embodiment, the target 313 which contains titanium and whose surface is not nitrided is installed at the cathode 315. It should be noted that the target 313 is not limited to be one whose surface is not nitrided, and the surface may be nitrided as long as metal mode sputtering is possible.

The substrate 101 on which the chalcogenide material layer 113 is deposited is placed on a substrate holder 301 in the treatment chamber 300 by a transfer robot 500. The treatment chamber 300 is exhausted so as to be a predetermined pressure (0.1-50 Pa) by the exhaust system 303.

Next, when the control section 310 drives the inert gas introduction means 307 to introduce an argon gas into the treatment chamber 300, film formation by sputtering is started. On the substrate, a titanium (Ti) layer is formed as the first electrode layer 114a.

Next, the inert gas introduction means 307 and the reactive gas introduction means 305 are driven so that an inert gas (argon gas) and a reactive gas (nitrogen gas) are introduced in the treatment chamber 300 at a predetermined flow rate ratio, respectively. The control section 310 controls the inert gas introduction means 307, the reactive gas introduction means 305, and the exhaust system 303 so that the flow rate of inert gas and that of the reactive gas are maintained so as to be the predetermined flow rate ratio.

As described later, "the predetermined flow rate ratio" is an optimal value for improving the adhesion between the chalcogenide material layer and the electrode layer.

When a high frequency power supply 320 or a DC power supply 321 is driven after a predetermined time elapsed from the gas introduction and when a predetermined voltage is applied to a cathode, plasma is generated in the treatment chamber 300 and film formation by sputtering is started. Ti target particles scattered from the target 313 containing titanium react with nitrogen as the reactive gas to form a titanium nitride (TiN) film as the second electrode layer 114b on the substrate on which the first electrode layer 114a is formed. It should be noted that the inert gas is not limited to argon gas and, for example. a helium (He) gas, a krypton (Kr) gas, a neon (Ne) gas, and xenon (Xe) gas can be used.

Figure 4:
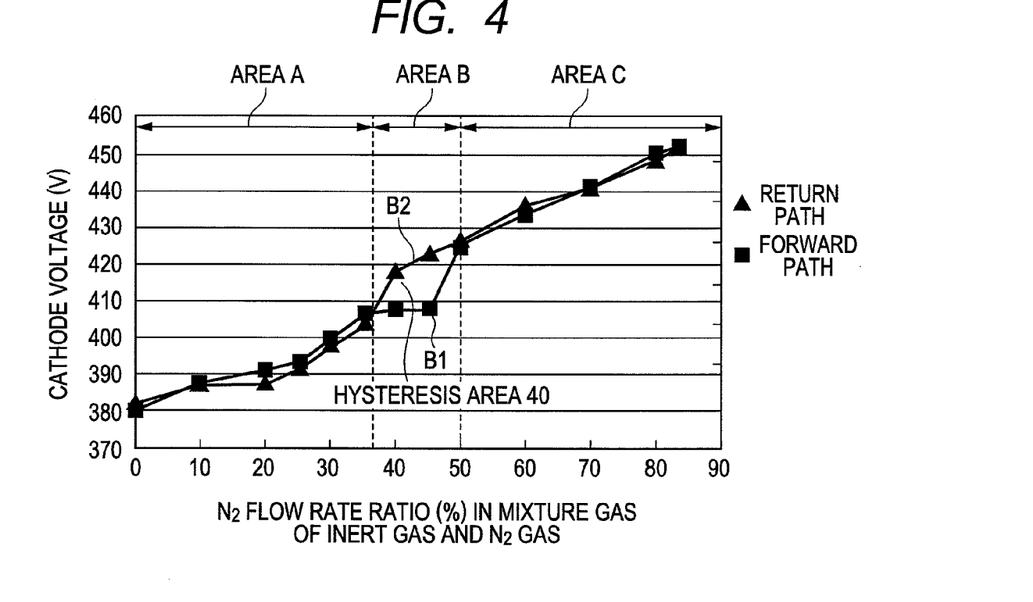
FIG. 4 is a view illustrating the relationship between the cathode voltage of the sputtering apparatus and the flow rate ratio of a reactive gas in a mixed gas according to one embodiment of the present invention.

With reference to FIG. 4, the relationship between the cathode voltage and the flow rate ratio of the reactive gas at the time of producing the second electrode layer 114b, will be explained. FIG. 4 is a graph illustrating the relationship between the cathode voltage and the flow rate ratio of the reactive gas in the mixed gas.

First, in the sputtering apparatus 55 illustrated in FIG. 3, using the titanium target (a target made up of a single metal having a purity equal to or greater than 99 wt %) whose surface is not nitrided, the flow rate ratio of the reactive gas (nitrogen gas) in the mixed gas of the inert gas (argon) and the reactive gas (nitrogen gas) was set to 0%. That is, the control section 310 carried out film deposition by sputtering while introducing only the argon gas in the chamber without introducing the reactive gas (nitrogen gas). The vertical axis of FIG. 4 illustrates the cathode voltage (■:380 V) after a predetermined time (for example, 10 seconds) elapsed from the time when a constant electric power (12 kW) is applied to the cathode.

In addition, in this specification, symbols ■ are plots of the cathode voltage with respect to the target whose surface is not nitrided, in each flow rate ratio in the case of increasing the flow rate ratio of the reactive gas in the mixed gas of the inert gas and the reactive gas from 0%. In FIG. 4, symbols ■ called "forward path".

Next, the control section 310 controlled the flow rate ratio of the nitrogen gas in the mixed gas to be 10%, and measured the cathode voltage after the predetermined time (for example, 10 seconds). At this time, as illustrated in FIG. 4, the cathode voltage indicated 387 V. This shows that the voltage was increased as a result of the electric current flow on the target surface becoming difficult to be flowed because resistance of the target surface was increased by the nitriding of the surface and the applied voltage was constant. Similarly, the cathode voltages when changing the flow rate ratio to 20%, 25%, 30%, 35%, 40%, 45%, 50%, 60%, 70%, 80%, and 85% were plotted as illustrated in FIG. 4 (■). In this way, when the flow rate ratio of the nitrogen gas is increased, nitriding of the surface of the titanium target occurs when the flow rate ratio of the nitrogen gas is increased and the electric resistance becomes large, and thus, the cathode voltage is also increased.

Subsequently, when, by using a titanium target whose surface was nitrided when the flow rate ratio of the nitrogen gas was set to 85%, the flow rate ratio of the nitrogen gas in the mixed gas was decreased to be 85%, 80%, 70%, 60%, 50%, 45%, 40%, 35%, 30%, 25%, 20%, and 10% in this order, the cathode voltages were measured and plotted (▲) as illustrated in FIG. 4. In this way, when the flow rate ratio of nitrogen gas was decreased, since the nitride of the surface of the titanium target was removed by sputtering and the electric resistance became small, the cathode voltage was decreased.

In addition, in this specification, symbols ▲ are plots of the cathode voltage with respect to the target whose surface is nitrided, in each flow rate ratio in the case of decreasing the flow rate ratio of the reactive gas in the mixed gas of the inert gas and the reactive gas. In FIG. 4, the symbols A are called "return path".

As illustrated in FIG. 4, in the area A in which the flow rate ratio is comparatively small, and area C in which the flow rate ratio is comparatively large, the plots (■) and the plots (▲) are changing similarly. However, the area B in which the flow rate ratio is 30 to 50%, serves as a hysteresis area 40.

The area A in which nitriding of the titanium target surface did not proceed or hardly proceeded, was in a so called metal mode (a sputtering technique in which the sputtered particles emitted from the target collide with the reactive gas in a gaseous phase to thereby form a reactive metal while the target surface hardly reacting with the reactive gas). However, in the area A, since the rate of reactive gas is small in terms of the flow rate ratio and the reactive gas is deficient, it is considered that nitriding of the TiN layer formed on the substrate is insufficient. In contrast, the area C is considered to be in a non-metal mode in which the nitriding of the titanium target surface proceeds considerably.

The area B exhibiting a hysteresis corresponds to the transition stage between the area A and the area C. Although, the hysteresis area B1 of "forward path" indicates a state (metal mode) in which nitriding of Ti (nitriding of the surface of the target) does not proceed, since sufficient amounts of reactive gas are present, it is considered that the TiN layer (the second electrode layer 114b) formed on the substrate is a high quality film.

In contrast, the hysteresis area B2 of "return path" is considered to be in a state (non-metal mode) in which the nitrided surface on the target surface is sputtered gradually. Accordingly, large areas of the surface of the target 313 are nitrided, making sputtering to be in the non-metal mode, and so it is considered that good sputtering of the target particles (Ti particles) from the target 313 becomes difficult.

In this way, in the present embodiment, the reactive gas is supplied using the target 313 capable of performing sputtering in a metal mode at a flow rate ratio included in the hysteresis area appearing in (represented by) the relationship between the cathode voltage and the flow rate ratio of the reactive gas in the mixed gas. Therefore, in the present embodiment, even in the metal mode sputtering, sufficient amounts of reactive gas can be supplied on the substrate, allowing the formation of a high quality film (for example, a TiN layer).

In the present specification, a "target capable of performing sputtering in a metal mode" is referred to as a target having a surface such that sputtering with respect to the target becomes a metal mode. Therefore, since metal mode sputtering can be performed, the use of a target whose surface is not reacted with the reactive gas (for example, a target whose surface is not nitrided) is preferable. In addition, even when the target surface is reacted with the reactive gas (for example, a part of the surface is nitrided), if the reaction of the target surface with the reactive gas is within a range acceptable for the metal mode sputtering, the target whose surface is partially reacted with the reactive gas can be used as the "target capable of performing sputtering in a metal mode". That is, the "target capable of performing sputtering in a metal mode" is referred to as a target capable of performing the metal-mode sputtering, regardless of whether the surface is reacted with the reactive gas or not (regardless of whether the surface is nitrided or not).

Figure 5A:
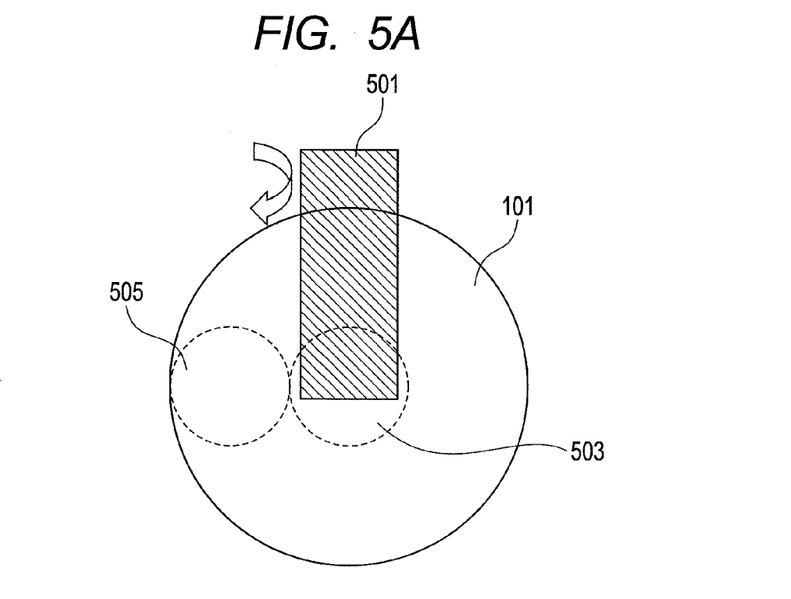
FIG. 5A is a view explaining a Peeling Test according to one embodiment of the present invention.
Figure 5B:
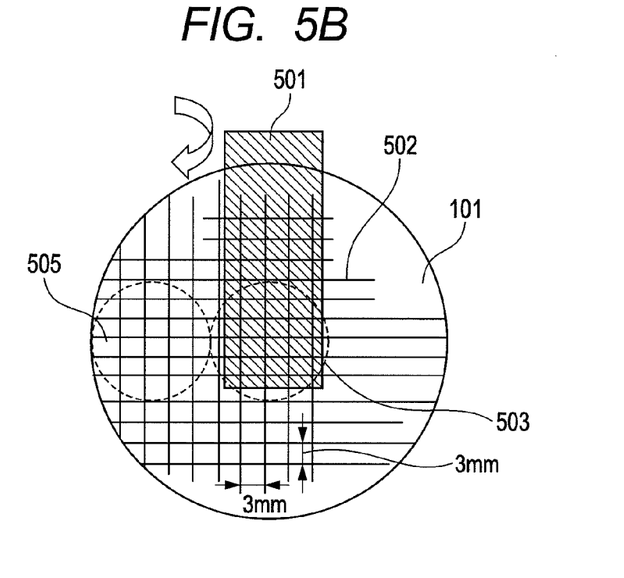
FIG. 5B is another view explaining the Peeling Test according to one embodiment of the present invention.
Figure 6:
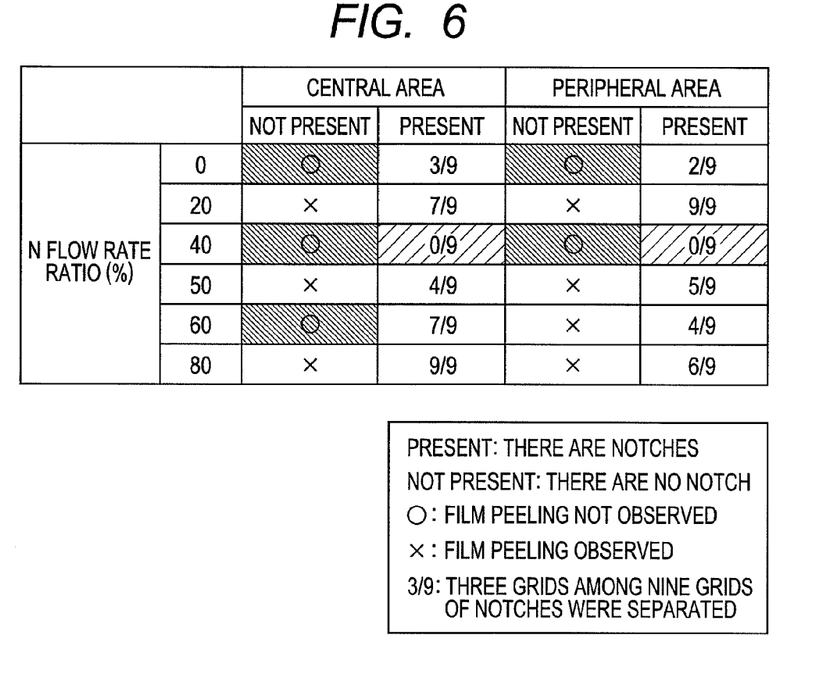
FIG. 6 is a view explaining the result of the Peeling Test according to one embodiment of the present invention.

With reference to FIGS. 5A, 5B and 6, peeling test of the second electrode layer 114b will be explained.

The peering test is referred to as a test in which the degree of adhesion between the chalcogenide layer and the upper electrode layer is measured by investigating whether a film is also peeled together with a tape or not when the tape adhered to the film formed on a substrate is peeled. Specifically, as illustrated in FIG. 5A, after forming the chalcogenide material layer 113, the first electrode layer (Ti) 114a, and the second electrode layer (TiN) 114b on the substrate 101 as mentioned above, a tape 501 was adhered to a central area 503 of the substrate, and then the tape was peeled. It should be noted that the substrate used here has a diameter $\phi$ of 300 mm. The central area 503 is a circular area with a radius of 50 mm from the center of the substrate. In a similar way, with respect to a peripheral area 505 of the substrate, the peeling test is carried out. It should be noted that the peripheral area 505 is a circular area with a radius of 50 mm along the periphery of the substrate.

Next, as illustrated in FIG. 5B, notches 502 are formed with a cutter on another substrate on which similar films (the chalcogenide material layer, the first electrode layer (Ti), and the second electrode layer (TiN)) are formed, in a grid at an interval of 3 mm. With respect to the substrate having the notches 502, the peeling test of the central area 503 and the peripheral area 505 is also carried out.

FIG. 6 illustrates the results of the peeling test described above.

Specifically, the peeling test is carried out with respect to the second electrode layer TiN formed on the first electrode layer 114a by using an un-nitrided pure titanium target, while controlling the flow rate ratio (%) of the nitrogen gas in the mixed gas to be a predetermined value. As illustrated in FIGS. 5A and 5B, the peeling test is carried out with respect to the substrate with notches and the substrate without notches at the central area 503 and the peripheral area 505 of each of the substrates.

It should be noted that, in FIG. 6, "N/9 (N: an integer from 1 to 9)" indicates that N squares of 9 squares partitioned by the notches 502 of the central area 503 or the peripheral area 505 have been peeled.

According to this, when the flow rate ratio of the nitrogen gas in the mixed gas is controlled to be 0% and 20%, that is, the flow rate ratio is in area A illustrated in FIG. 4, the results of the peeling test indicates that relatively large areas of the second electrode layer 114b have been peeled, and thus, it is considered that the degree of adhesion of the film is poor.

Similarly, when the flow rate ratio of the nitrogen gas in the mixed gas is controlled to be 50%, 60% and 80%, that is, the flow rate ratio is in area C illustrated in FIG. 4, the results of the peeling test indicates that relatively large areas of the second electrode layer 114b have been peeled, and thus, it is considered that the degree of adhesion of the film is poor.

However, when the flow rate ratio of the nitrogen gas in the mixed gas is controlled to be 40%, or in cases of 38% and 45% (not illustrated in FIG. 6), it is known that adhesion of the film is improved. That is, when the flow rate ratio is in the area B (hysteresis area) illustrated in FIG. 4, the results of the peeling test indicates that the second electrode layer 114b has not been peeled, and thus, it is considered that the degree of adhesion of the film is high. More specifically, in hysteresis area B1 of the area B representing hysteresis, sufficient amounts of reactive gas are present in a state (metal mode) where nitriding of titanium at the surface of the target 313 does not proceed, and thus, it is considered that a high quality TiN layer is formed as the second electrode layer, and, as a result, the degree of adhesion of the film is improved.

That is, in the present embodiment, the target 313 whose surface is not nitrided is installed at the cathode 315 as a "target capable of performing sputtering in a metal mode". The control section 310 controls the reactive gas introduction means 305 and the inert gas introduction means 307 so as to supply a nitrogen gas at a flow rate ratio of the nitrogen gas in the mixed gas of an argon gas (inert gas) and the nitrogen gas (reactive gas), corresponding to a hysteresis area appearing in (represented by) the relationship between the cathode voltage applied to the cathode 315 and the flow rate ratio of the mixed gas of the argon gas (inert gas) and the nitrogen gas (reactive gas). Accordingly, in the hysteresis area, in spite of being in a metal mode in which the surface of the target 13 is hardly nitrided, large amounts of nitrogen gas are also present. That is, the hysteresis area is an area in which large amounts of nitrogen gas as the reactive gas can be present, and nitriding of the surface of the target 313 can be suppressed as much as possible. Accordingly, by supplying the nitrogen gas in the treatment chamber 300 at a flow rate ratio in the area, it is possible to react well the supplied nitrogen gas with target particles scattered from the target 313 while preventing as much as possible nitriding of the surface of the target 313 by the supplied nitrogen gas from proceeding.

In contrast, in the case of the area A in FIG. 4, nitriding of the surface of the target 313 does not proceed practically (metal mode), but the amounts of the nitrogen gas reacting with the target particles sputtered from the target 313 are few. Accordingly, the reaction between the target particles and the nitrogen gas is not carried out sufficiently, and thus, the formation of a high quality TiN film is not performed. Furthermore, in case of the area C in FIG. 4, the surface of the target 313 is nitrided (non-metal mode), and sputtering of the target particles (Ti particles) from the target 313 containing Ti is not performed well. As a result, the target particles to be used for the reaction with the nitrogen gas cannot be fully secured.

In contrast to this, by carrying out supply of the reactive gas at a flow rate ratio corresponding to the hysteresis area illustrated in FIG. 4, the reactive gas and the target particles can be secured well, and a high quality electrode layer can be formed. Therefore, the degree of adhesion between the chalcogenide layer and the electrode layer formed thereon can be improved.

In addition, according to the above mentioned result illustrated in FIG. 4, when the flow rate ratio of the nitrogen gas in the mixed gas is from 36% to 50%, the hysteresis area is performed. However, the result depends on the device configuration or species of the gas and generally, it is considered that the hysteresis area is formed when a flow rate ratio of the reactive gas in the mixed gas is in a range of 20% to 80%.

Furthermore, according to the present invention, to what percent the flow rate ratio of the reactive gas should be set is not important, but, it is important to carry out supply of the reactive gas at a flow rate ratio corresponding to the hysteresis area represented by (appearing in) the relationship between the cathode voltage and the flow rate ratio of the reactive gas in the mixed gas, the hysteresis area being determined by the reactive gas, the mixed gas and the target material etc. to be used for sputtering. With regard to the extraction of such a hysteresis area, the hysteresis area may be extracted by obtaining the relationship between the cathode voltage and the flow rate ratio of the reactive gas in the mixed gas of the inert gas and the reactive gas by using the method for generating FIG. 4 described above according to the species of gases, the material of the target, and the device configuration to be used for sputtering.

Furthermore, although, in the present embodiment, a laminated body of the first electrode layer 114a and the second electrode layer 114b is used as the upper electrode layer 114 formed on the chalcogenide material layer 113, the first electrode layer 114a may not be formed, and the second electrode layer 114b such as a TiN layer, for example, may be formed directly on the chalcogenide material layer 113. That is, according to the present embodiment, it is important to improve the degree of adhesion of the second electrode layer 114b, and, for this purpose, it is essential to supply the reactive gas at a flow rate ratio in the hysteresis area mentioned above.

Example

Figure 7:
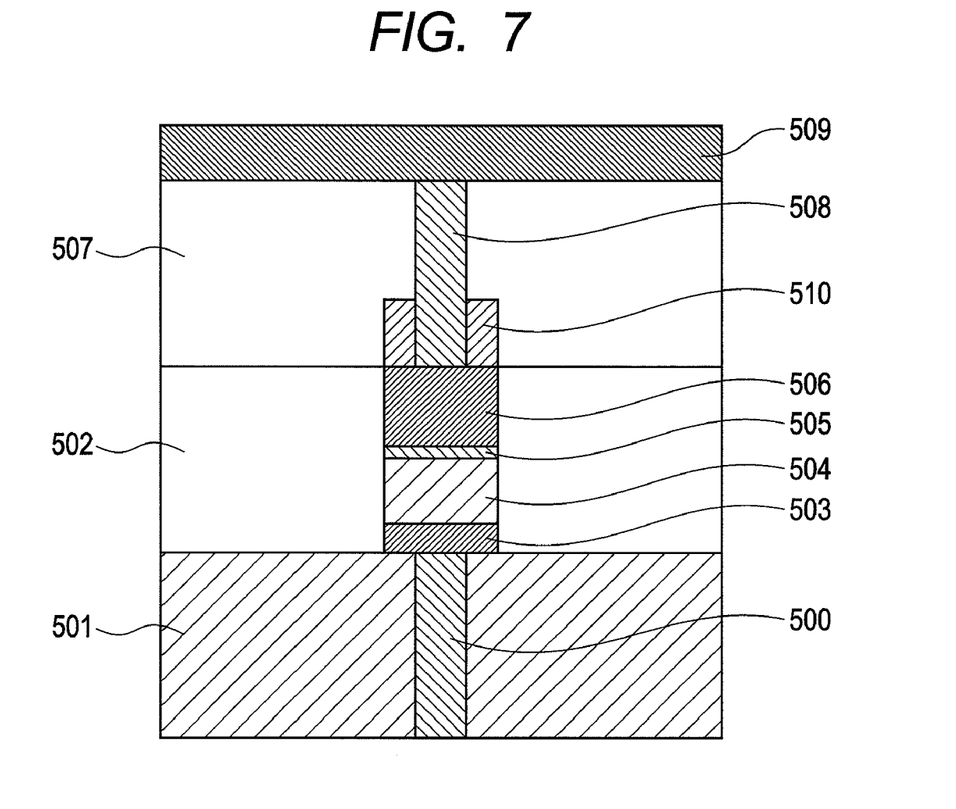
FIG. 7 is a view explaining a phase change memory element according to one embodiment of the present invention.

With reference to FIG. 7, an example according to the present invention will be explained. In this example, by introducing the reactive gas at a flow rate ratio of the reactive gas included in a hysteresis area exhibiting the relationship between the cathode voltage and the flow rate ratio of the reactive gas in the mixed gas in a step of forming the second electrode layer, peeling of a film is suppressed.

Although not illustrated in figures, first, a semiconductor substrate is prepared, and an MOS transistor used as a selection transistor is formed thereon. As for a method for forming an MOS transistor section, many techniques can be used, however, there is no direct causal relationship between the method and the present invention, but the present invention can be applied for MOS transistors formed by any method.

In order to join the transistor formed on the semiconductor substrate to a lower layer wiring part, tungsten was embedded in an interlayer insulating film 501 by means of CVD, and a tungsten plug 500 was formed by a well-known CMP method.

Next, as a lower layer electrode 503, a metal-based material film such as a TiN film or a WN film is formed by using a sputtering method.

Next, a chalcogenide material layer 504 made of GeSbTe and having a thickness of 100 nm was deposited on the substrate in a film formation step by a sputtering method. With regard to the step, specific conditions in the sputtering apparatus will be explained.

First, in order to remove moisture adsorbed on the surface of the semiconductor substrate, the substrate was subjected to pre-heating at a temperature of 150° C. to 200° C. in a vacuum for 30 seconds. Subsequently, the semiconductor substrate was transferred in a cooling room provided in the sputtering apparatus, and cooled there to a temperature of 100° C. or less. Subsequently, the substrate was transferred in a sputtering chamber, and the GeSbTe film was formed by a sputtering method, while controlling the semiconductor substrate temperature to be 100° C. or less. By these steps, a chalcogenide material layer 504 can be formed in an amorphous state.

Next, as illustrated in FIG. 7, the upper electrodes 505 and 506 made up of titanium and titanium nitride having a thickness of 51 nm, respectively were deposited on the substrate by the sputtering method according to the present invention. Specifically, a titanium film having a thickness of 1 nm and serving as a first electrode layer and a titanium nitride film having a thickness of 50 nm and serving as a second electrode layer were formed. That is, in a step of forming the second electrode layer, the film was formed by sputtering using a pure Ti target of which surface was not nitrided, while being controlled so as to introduce the reactive gas at a flow rate ratio of the reactive gas in the hysteresis area exhibiting the relationship between the cathode voltage and the flow rate ratio of the reactive gas in the mixed gas.

Subsequently, a silicon oxide film 510 was deposited on the substrate by a well-known CVD process. Subsequently, the silicon oxide film 510, the upper electrodes 505 and 506, and the chalcogenide material layer 504 were processed sequentially by a well-known lithography process and a well-known dry etching process.

After that, the interlayer insulating film 507 made up of a silicon oxide film was deposited on the whole surface, and surface unevenness was smoothed by a well-known CMP method. Subsequently, a plug contact hole was bored by a lithography process and a dry etching process. Subsequently, in the plug contact hole, tungsten was embedded and a tungsten plug 508 was formed by the well-known CMP process. Subsequently, aluminum having a thickness of 200 nm was deposited, and a wiring layer 509 was formed by processing the deposition. Of course, it is also possible to use copper with low resistance instead of aluminum.

By these steps, the phase change memory element of this example illustrated in FIG. 7 is substantially completed. In addition, since heat treatment at 400° C. or more is required in the steps of forming a plug and a wiring (for example, the upper electrode 506 to the wiring layer 509), the chalcogenide material layer 504 formed in an amorphous state crystallizes into hcp structure by the manufacturing process of the phase change memory.

According to the present example, by introducing the reactive gas at a flow rate ratio of the reactive gas, included in the hysteresis area exhibiting the relationship between the cathode voltage and the flow rate ratio of the reactive gas in a mixed gas, peeling at the interface of the chalcogenide etc. and the upper electrode layer can be suppressed. More specifically, by introducing the reactive gas in a so called metal mode (a sputtering technique in which the sputtered particles emitted from the target collide with the reactive gas in a gaseous phase to thereby form a reactive metal while the target surface hardly reacting with the reactive gas), and, at a flow rate ratio of the reactive gas, included in the hysteresis area exhibiting the relationship between the cathode voltage and the flow rate ratio of the reactive gas in a mixed gas, peeling at the interface of the chalcogenide etc. and the upper electrode layer can be suppressed.

In the example described above, GeSbTe is used as the chalcogenide material layer, however, the material is not limited to GeSbTe, and a chalcogenide material containing at least two or more elements selected from Ge, Sb and Te, may be used. Furthermore, a chalcogenide material containing at least two or more elements selected from Ge, Sb and Te, and at least one element selected from the group consisting of 2b, 1b, 3a to 7a, and 8 of periodic table including, for example, using As (arsenic) instead of Ge, may be used.

The invention claimed is:

1. A method of manufacturing a semiconductor memory device, comprising:
a first step of forming a chalcogenide material layer; and a second step of forming an electrode layer on the chalcogenide material layer by sputtering through the use of a mixture gas of a reactive gas which is a nitrogen gas and an inert gas, while applying a cathode voltage to a target which is made up of titanium or tungsten, wherein the target is a target capable of performing sputtering in a metal mode, in the second step, introduction of the reactive gas is carried out at a flow rate ratio of the reactive gas in the mixture gas corresponding to a hysteresis area appearing in a curve of the cathode voltage with respect to a flow rate ratio of the reactive gas in the mixture gas, the hysteresis area is an area in which a first curve of the cathode voltage when the flow rate ratio of the reactive gas in the mixture gas is increased, and a second curve of the cathode voltage when the flow rate ratio of the reactive gas in the mixture gas is decreased, are different from each other, and the cathode voltage of the first curve at a predetermined flow rate ratio in the hysteresis area is smaller than that of the second curve at the predetermined flow rate ratio, and in the second step, the cathode voltage is included in the first curve.

2. The method of manufacturing a semiconductor memory device according to claim 1, wherein the target is made up of titanium, and the nitrogen gas is introduced at a flow rate ratio of the nitrogen gas in a range of 20% to 80%.

3. The method of manufacturing a semiconductor memory device according to claim 1, wherein another electrode layer is further formed between the chalcogenide material layer and the electrode layer, further comprising a third step of forming the other electrode on the chalcogenide material layer, before the second step.

4. A sputtering apparatus for forming an electrode layer on a chalcogenide layer, comprising:

a treatment chamber;

a cathode disposed to the treatment chamber and for mounting a target thereon;

an inert gas introduction means for introducing an inert gas in the treatment chamber;

a reactive gas introduction means for introducing a reactive gas, that is a nitrogen gas, in the treatment chamber; and a control section controlling the inert gas introduction means and the reactive gas introduction means, wherein when the target mounted on the cathode is made up of titanium or tungsten, during forming the electrode layer, the control section controls the inert gas introduction means and the reactive gas introduction means so as to introduce the reactive gas to the treatment chamber at a flow rate ratio corresponding to a hysteresis area appearing in a curve of a cathode voltage applied to the cathode with respect to a flow rate ratio of the reactive gas in a mixture gas of the reactive gas and the inert gas, the hysteresis area is an area in which a first curve of the cathode voltage when the flow rate ratio of the reactive gas in the mixture gas is increased, and a second curve of the cathode voltage when the flow rate ratio of the reactive gas in the mixture gas is decreased, are different from each other, and the cathode voltage of the first curve at a predetermined flow rate ratio in the hysteresis area is smaller than that of the second curve at the predetermined flow rate ratio, and the cathode voltage applied to the cathode is included in the first curve.

* * * * *